(12) United States Patent
Lavoie et al.

(10) Patent No.: US 8,278,200 B2
(45) Date of Patent: Oct. 2, 2012

(54) METAL-SEMICONDUCTOR INTERMIXED REGIONS

(75) Inventors: Christian Lavoie, Pleasantville, NY (US); Tak H. Ning, Yorktown Heights, NY (US); Ahmet S. Ozcan, Pleasantville, NY (US); Bin Yang, Ossining, NY (US); Zhen Zhang, Ossining, NY (US)

(73) Assignees: International Business Machines Corpration, Armonk, NY (US); Globalfoudries Inc., Grand Cayman (KY)

( * ) Notice: Subject to any disclaimer, the term of this patent is extended or adjusted under 35 U.S.C. 154(b) by 0 days.

(21) Appl. No.: 13/012,043

(22) Filed: Jan. 24, 2011

(65) Prior Publication Data

US 2012/0190192 A1 Jul. 26, 2012

(51) Int. Cl.
H01L 21/20 (2006.01)
(52) U.S. Cl. ........ 438/584; 438/597; 438/660; 438/664; 257/E21.091; 427/69; 427/78
(58) Field of Classification Search .................. 438/584, 438/597, 660, 663, 664; 257/E21.091; 427/69, 427/78, 96.8, 497, 509
See application file for complete search history.

(56) References Cited

U.S. PATENT DOCUMENTS

| | | | | |
|---|---|---|---|---|
| 6,346,477 | B1 | 2/2002 | Kaloyeros et al. | 438/680 |
| 7,268,065 | B2 | 9/2007 | Lin et al. | 438/510 |
| 7,419,907 | B2 | 9/2008 | Detavernier et al. | 438/682 |
| 2004/0023253 | A1* | 2/2004 | Kunwar et al. | 435/6 |
| 2006/0138562 | A1* | 6/2006 | Okuno et al. | 257/384 |
| 2006/0163670 | A1 | 7/2006 | Ellis-Monaghan et al. | 257/388 |
| 2008/0132011 | A1* | 6/2008 | Lee et al. | 438/191 |
| 2009/0294871 | A1 | 12/2009 | Besser | 257/384 |
| 2010/0065804 | A1 | 3/2010 | Park | 257/4 |
| 2010/0075499 | A1 | 3/2010 | Olsen | 438/682 |
| 2010/0163938 | A1 | 7/2010 | Park | 257/288 |

OTHER PUBLICATIONS

Z. Zhang, B. Yang, Y. Zhu, S. Gaudet, S. Rossnagel, A.J. Kellock, A. Ozcan, C. Murray, P. Desjardins, S. Zhang, J. Jordan-Sweet and C. Lavoie, "Exploitation of a self-limiting process for reproducible formation of ultrathin $Ni_{1-x}Pt_x$ silicide films", Appl. Phys. Lett. 97, 252108 (2010).

A. Hiraki, K. Shuto, S. Kim, W. Kammura, and M. Iwami, "Room temperature interfacial reaction in Au-semiconductor systems", Appl. Phys. Lett. 31, 611 (1977).

J.R. Abelson, K.B. Kim, D.E. Mercer, C.R. Helms, R. Sinclair, and T.W. Sigmon, "Disordered intermixing at the platinum:silicon interface demonstrated by high-resolution coss-sectional transmission electron microscopy, Auger electron spectroscopy, and MeV ion channeling", J. Appl. Phys. 63, 689 (1988).

(Continued)

*Primary Examiner* — Khiem D Nguyen
(74) *Attorney, Agent, or Firm* — Harrington & Smith

(57) ABSTRACT

In one exemplary embodiment, a program storage device readable by a machine, tangibly embodying a program of instructions executable by the machine for performing operations, said operations including: depositing a first layer having a first metal on a surface of a semiconductor structure, where depositing the first layer creates a first intermix region at an interface of the first layer and the semiconductor structure; removing a portion of the deposited first layer to expose the first intermix region; depositing a second layer having a second metal on the first intermix region, where depositing the second layer creates a second intermix region at an interface of the second layer and the first intermix region; removing a portion of the deposited second layer to expose the second intermix region; and performing at least one anneal on the semiconductor structure.

15 Claims, 11 Drawing Sheets

OTHER PUBLICATIONS

J. Abelsen et al., "Disordered Intermixing at the Platinum:Silicon Interface Demonstrated by High-Resolution Cross-Sectional Transmission Electron Microscopy, Auger Electron Spectroscopy and MeV Ion Channeling", J. Appl. Phys. 63(3), Feb. 1, 1988.

R. Donaton et al., "New Techniques for Forming Continuous, Smooth, and Uniform Ultrathin (3 nm) PtSi Layers", Electrochemical and Solid-State Letters, 2 (4), 195-197, 1999.

A. Hiraki et al., "Room-Temperature Interfacial in Au-Semiconductor Systems", Applied Physics Letters, vol. 31, No. 9, Nov. 1, 1977.

* cited by examiner

METAL-SEMICONDUCTOR INTERMIXED REGIONS

TECHNICAL FIELD

The exemplary embodiments of this invention relate generally to semiconductor structures and, more specifically, relate to the formation of semiconductor structures that have a metal-semiconductor intermixed region.

BACKGROUND

This section endeavors to supply a context or background for the various exemplary embodiments of the invention as recited in the claims. The content herein may comprise subject matter that could be utilized, but not necessarily matter that has been previously utilized, described or considered. Unless indicated otherwise, the content described herein is not considered prior art, and should not be considered as admitted prior art by inclusion in this section.

Au(evaporated film)-semiconductor(substrate) systems have been studied by Auger electron spectroscopy. For semiconductors with energy gaps ($E_g$) smaller than ~2.5 eV, even at room temperature a fraction of atoms constituting the semiconductors were found to accumulate on the surfaces of Au films, indicating ready interfacial interaction between the materials. Study of the interface regions of the systems verified the occurrence of the room-temperature interfacial reactions. Hiraki et al., "*Room-temperature interfacial reaction in Au-semiconductor systems,*" *Applied Physics Letters*, Vol. 31, No. 9, pp. 611-612 (Nov. 1, 1977).

The metallurgical interaction at the interface between single-crystal silicon substrates and thin films of elemental platinum have also been examined. This study identified the existence of a 30-Å-thick layer of intermixed Platinum and Silicon which forms at the metal-silicide interface when 50 Å of Pt is electron beam evaporated onto room-temperature Si. The interfacial layer is evident in the high-resolution cross-sectional transmission electron microscopy (HRXTEM) as a uniform band of dark and noncrystalline contrast. In Auger sputter profiling, the evolution of the Si LVV line shape indicated the presence of a Platinum silicide region adjacent to the film/Si interface but not at the surface of the Pt film. Abelson et al., "*Disordered intermixing at the platinum: silicon interface demonstrated by high-resolution cross-sectional transmission electron microscopy, Auger electron spectroscopy, and MeV ion channeling,*" *J. Appl. Phys.*, Vol. 63, No. 3, pp. 689-692 (Feb. 1, 1988).

Another study considered an interfacial intermixed Pt—Si layer formed during Pt sputtering at room temperature with a subsequent selective etch to form ultrathin PtSi layers. The etching, performed after the metal deposition, removed Pt at fast rates. The etch rate was slowed when the Pt—Si interfacial layer was reached and an oxide was formed on top of the intermixed Pt—Si layer, preventing further etching. During the process, a short-range diffusion technique was believed to transform the intermixed Pt—Si layer into a 3 nm thick continuous PtSi film. A subsequent annealing resulted in a more uniform grain size distribution, without changing the other characteristics of the film. The silicide formed was insensitive to sputter conditions such as sputter power and time. Donaton et al., "*New Technique for Forming Continuous, Smooth, and Uniform Ultrathin (3 nm) PtSi Layers,*" *Electrochemical and Solid-State Letters*, Vol. 2, No. 4, pp. 195-197 (1999).

BRIEF SUMMARY

In one exemplary embodiment of the invention, a program storage device readable by a machine, tangibly embodying a program of instructions executable by the machine for performing operations, said operations comprising: depositing a first layer comprised of a first metal on a surface of a semiconductor structure, where depositing the first layer creates a first intermix region at an interface of the first layer and the semiconductor structure; removing a portion of the deposited first layer to expose the first intermix region; depositing a second layer comprised of a second metal on the first intermix region, where depositing the second layer creates a second intermix region at an interface of the second layer and the first intermix region; removing a portion of the deposited second layer to expose the second intermix region; and performing at least one anneal on the semiconductor structure.

In another exemplary embodiment of the invention, a method comprising: depositing a first layer comprised of a first metal on a surface of a semiconductor structure, where depositing the first layer creates a first intermix region at an interface of the first layer and the semiconductor structure; removing a portion of the deposited first layer to expose the first intermix region; depositing a second layer comprised of a second metal on the first intermix region, where depositing the second layer creates a second intermix region at an interface of the second layer and the first intermix region; removing a portion of the deposited second layer to expose the second intermix region; and performing at least one anneal on the semiconductor structure.

In another exemplary embodiment of the invention, a method comprising: depositing, using ionized physical vapor deposition, a layer comprised of a metal on a surface of a semiconductor structure, where depositing the layer creates an intermix region at an interface of the layer and the semiconductor structure, where depositing the layer comprises controlling an energy of incident atoms in order to achieve a desired characteristic of the intermix region; and removing a portion of the deposited layer to expose the intermix region.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein.

DETAILED DESCRIPTION

Figure 1:
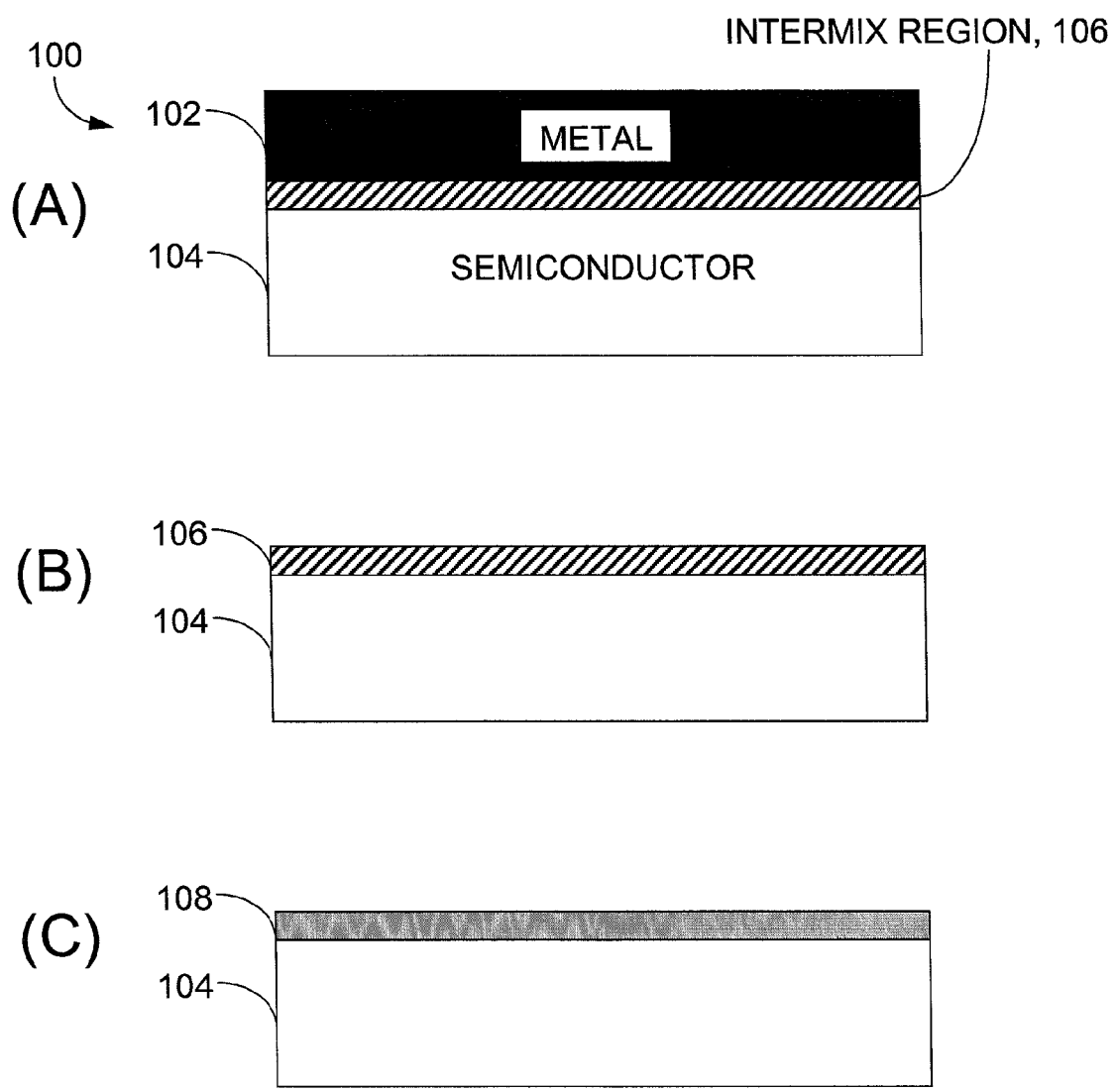
FIG. 1 illustrates an exemplary one-stage process for forming an intermix region on a semiconductor device.

A very thin intermixed or interfacial region is formed when a metal is sputtered onto a semiconductor (e.g., Si, a substrate, a Si substrate, a silicon-on-insulator substrate, a semiconductor-on-insulator substrate). As a non-limiting example, the intermix region may originate from the high energy of the incoming sputtered atoms which are thus pushed into the Si lattice. While the Si lattice is a dense way to pack Si atoms, it is a relatively open structure as the bonding is covalent. The first few metal atoms, arriving with relatively high energy, can be forced into the interstitial sites of the Si lattice and form a thin region of mixed Si and metal on the order of 3-5 nm in thickness, for example. In some cases, the intermix region may have a relatively high Si content (e.g., greater than 50% Si in atomic composition). It is possible to use standard etching techniques to selectively remove the metal and retain the intermixed region. Typically the layer is amorphous and a subsequent anneal will crystallize the intermix region into a lower resistance layer (e.g., silicide).

The advantages of the intermix region and process are multi-fold. First, it allows for the formation of a very thin contact layer that is normally very difficult to control with standard sputtering tools currently in use and/or production. Second, the intermix region is much more conformal on Si structures that are not planar. Third, upon annealing of the amorphous thin intermix region, very little if any metal diffusion is needed to form the low resistance contact layer. In fact, for the crystallization of amorphous layers, it may be that only local rearrangement is used. Since extraneous metal diffusion is often a source of defects in small devices, it is an advantage to use a process in which diffusion is limited. One disadvantage of current intermix processes is that, since the film is so thin, the resistivity may be too high for the resulting film to be used in devices. As an example, a conventional metal-Si intermix process may result in an intermixed region with a sheet resistance ($R_s$) greater than 100 Ohms/square.

The exemplary embodiments of the invention address this and other problems by providing for the formation of an intermix region with a lower resistivity (e.g., $R_s$<100 Ohms/square). Such exemplary intermix regions (films) may have additional uses and applications that were not previously attainable using conventional intermix techniques. Furthermore, such exemplary intermix films may enable the production of semiconductor devices and structures having improved properties and/or performance. For example, the exemplary intermix region may be thicker than conventional ones. Such exemplary, thicker intermix regions may be easier to achieve for current tool sets and, in addition, may allow for coverage of Si facets that are exposed to the metal deposition (e.g., even if such Si facets are the vertical portion of a fin of high aspect ratio). In some exemplary embodiments, the low resistance intermix region may comprise a silicide (e.g., to be used in conjunction with one or more contacts, contact pads or contact regions).

Since the silicide is formed without much metal diffusion, there are at least two consequences to note. In a random cross-section, the silicide may encroach much less under the spacers as compared with a conventional metal deposition and anneal. Furthermore, drastic encroachment on defective silicon areas may be substantially reduced or eliminated. If the source of the metal is removed before the anneals (e.g., etching away the non-intermixed metal), the fast diffusion of metal on a dislocation is reduced or eliminated. Diffusion at defects may cause irregular and/or drastic encroachment, sometimes leading to shorting the source and/or drain (for transistors), for example, and in some cases it may constitute an important yield detractor (e.g., for static random access memory (SRAM) structures and devices). In addition, the exemplary embodiments of the invention provide various manufacturing improvements over conventional techniques, including improved reproducibility and/or improved uniformity of the resulting thin film.

Ohms per square ("Ohms/sq." or "$\Omega$/sq.") is a standard unit of resistance for thin films, generally referred to as "sheet resistance." The selected square can be of any size and it will always have the same resistance. This unit is very useful for circuit designers in cases where only the number of squares matter. The resistance (R) of a piece of material is $R=\rho*L/A$, where $\rho$ is the resistivity, L is the distance the charge carriers need to travel and A is the section of material perpendicular to the current. If one defines a rectangular or square section of film, then A is defined as $L*t$, where t is the thickness of the film (assuming substantially uniform thickness). Once this square is defined, the "sheet resistance" becomes: $R_s=\rho L/(L*t)$ or $R_s=\rho/t$. This unit, $R_s$, can be measured using a standard 4-point probe system. Once the thickness (t) of the film is determined, the film resistivity ($\rho$) can be calculated by multiplying $R_s$ with t.

Figure 2:
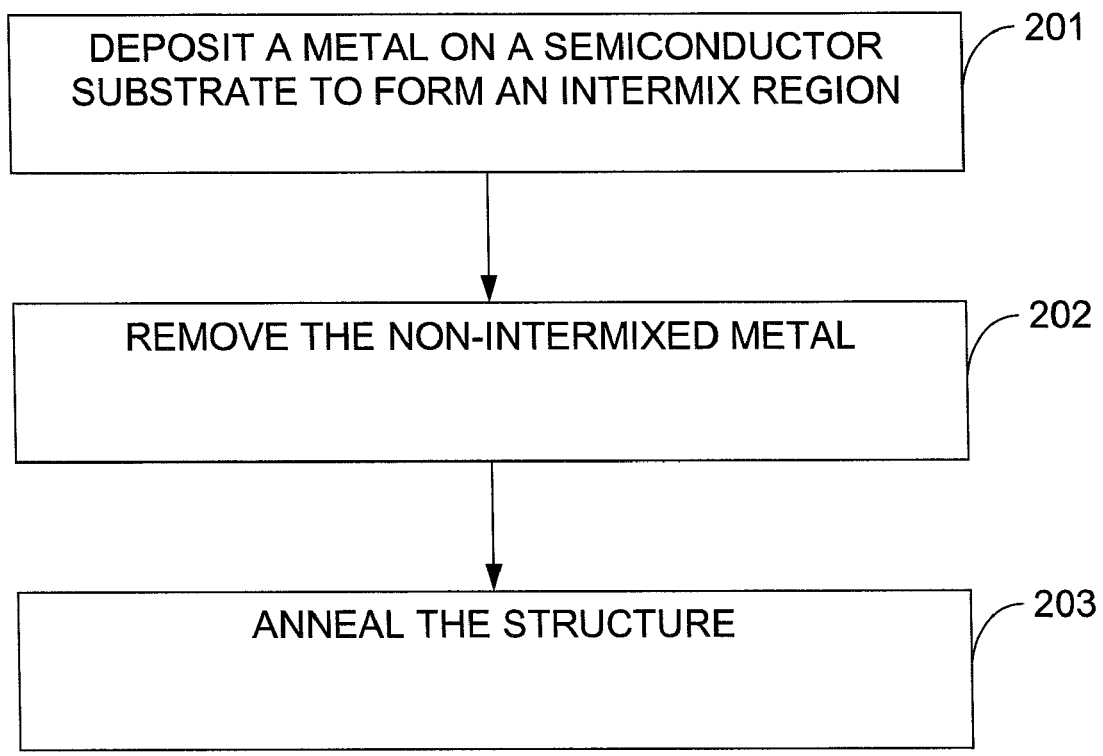
FIG. 2 depicts a flowchart illustrating the steps performed in the exemplary one-stage process of FIG. 1.

FIG. 1 illustrates an exemplary "one-stage" process for forming an intermix region 108 on a semiconductor device 100. FIG. 2 depicts a flowchart illustrating the steps performed in the exemplary process of FIG. 1. In FIG. 1A, a metal 102 is deposited on a semiconductor substrate 104 to form an intermix region 106 (step 201). In FIG. 1B, the non-intermixed metal is removed (step 202). At this point, the intermix region 106 is amorphous. In FIG. 1C, the resulting structure is annealed to crystallize the intermix region 108 and lower its resistance (step 203).

The exemplary embodiments of the invention take the one-stage process of FIGS. 1 and 2 and further modify it. As one non-limiting example, and as discussed below with reference to FIGS. 3 and 4, there may be multiple depositions and multiple removals (e.g., etches) prior to the anneal. For example, the process may include: deposit1, etch1, deposit2, etch2, anneal. As another non-limiting example, and as discussed below with reference to FIGS. 5 and 6, there may be multiple depositions and multiple removals (e.g., etches) with multiple anneals by performing at least one anneal after each removal/etch. For example, the process may include: deposit1, etch1, anneal1, deposit2, etch2, anneal2. By using these and/or other exemplary processes described herein, a thicker intermix region is formed, thus reducing resistivity of the film.

Figure 3:
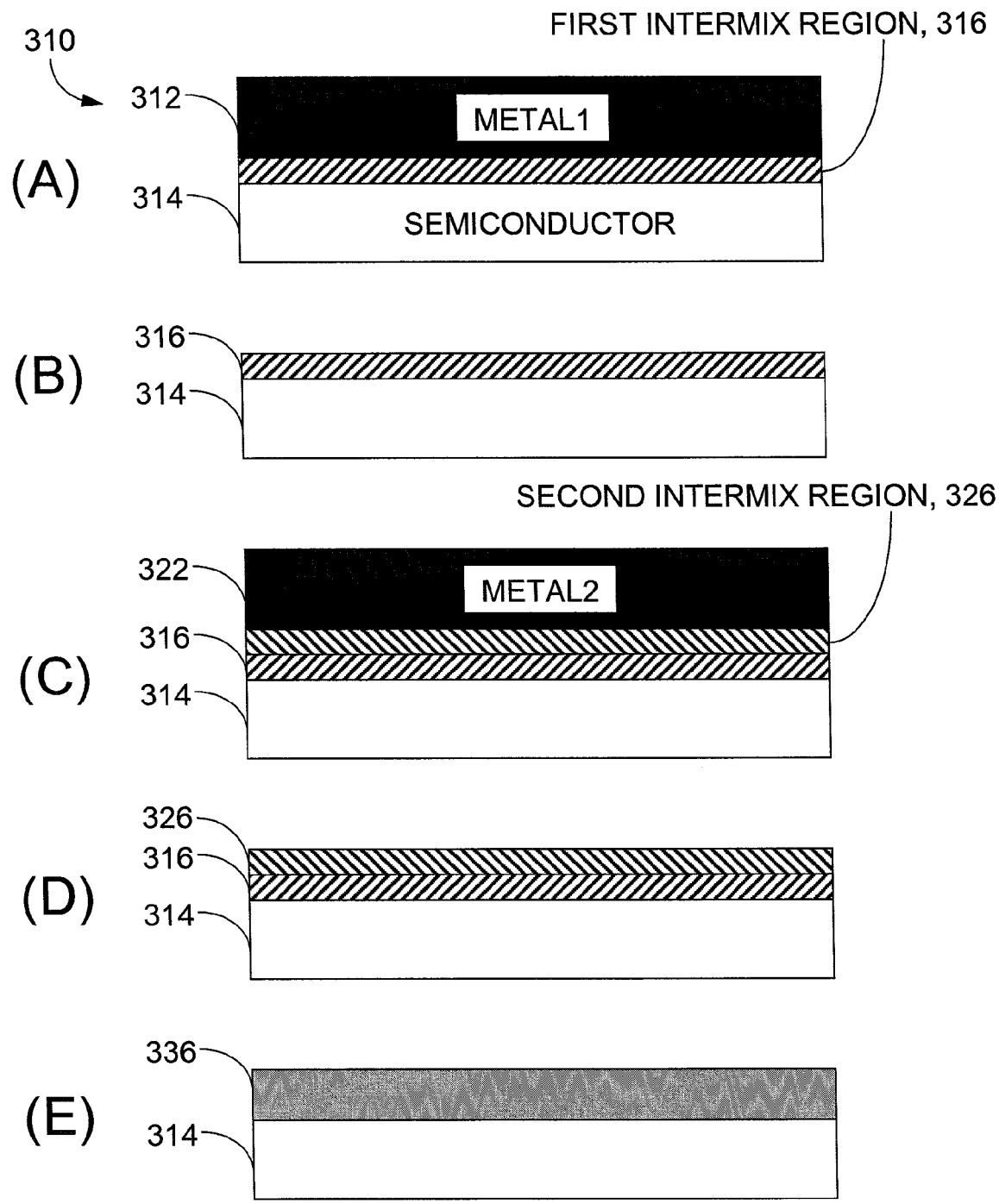
FIG. 3 illustrates an exemplary multi-stage process for forming an intermix region on a semiconductor device in accordance with the exemplary embodiments of the invention.
Figure 4:
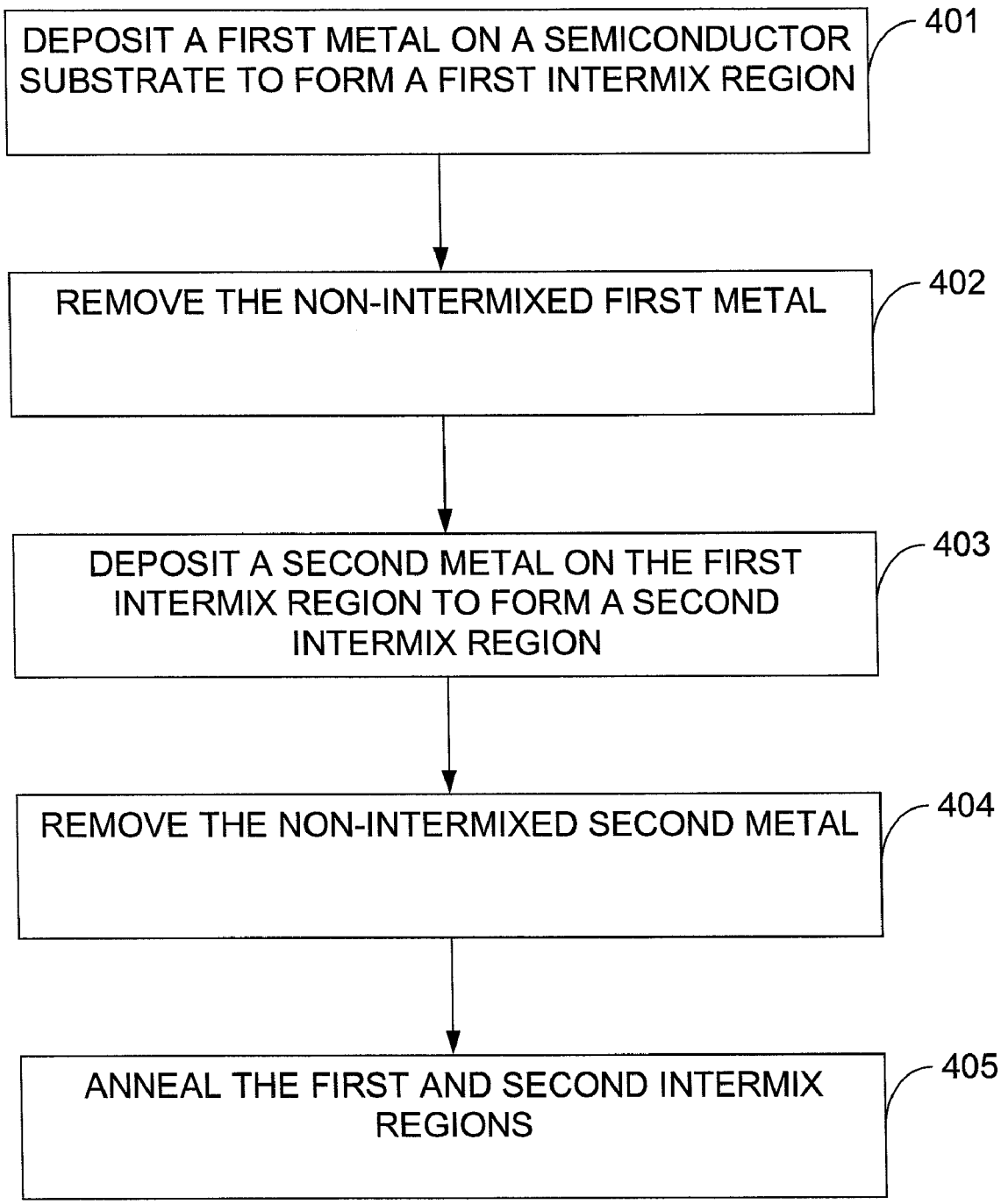
FIG. 4 depicts a flowchart illustrating the steps performed in the exemplary multi-stage process of FIG. 3.

FIG. 3 illustrates an exemplary multi-stage process for forming an intermix region 336 on a semiconductor device 310 in accordance with the exemplary embodiments of the invention. FIG. 4 depicts a flowchart illustrating the steps performed in the exemplary multi-stage process of FIG. 3. In FIG. 3A, a first metal (metal1) 312 is deposited on a semiconductor substrate 314 to form a first intermix region 316 (step 401). In FIG. 3B, the non-intermixed first metal is removed (step 402). At this point, and as an example, the first intermix region 316 may be amorphous. In FIG. 3C, a second metal (metal2) 322 is deposited on the first intermix region 316 to form a second intermix region 326 (step 403). In FIG. 3D, the non-intermixed second metal is removed (step 404). At this point, and as an example, the second intermix region 326 also may be amorphous. In FIG. 3E, an anneal is performed to crystallize the first and second intermix regions and form a single intermix region 336 having a lower resistance (step 405).

Figure 5:
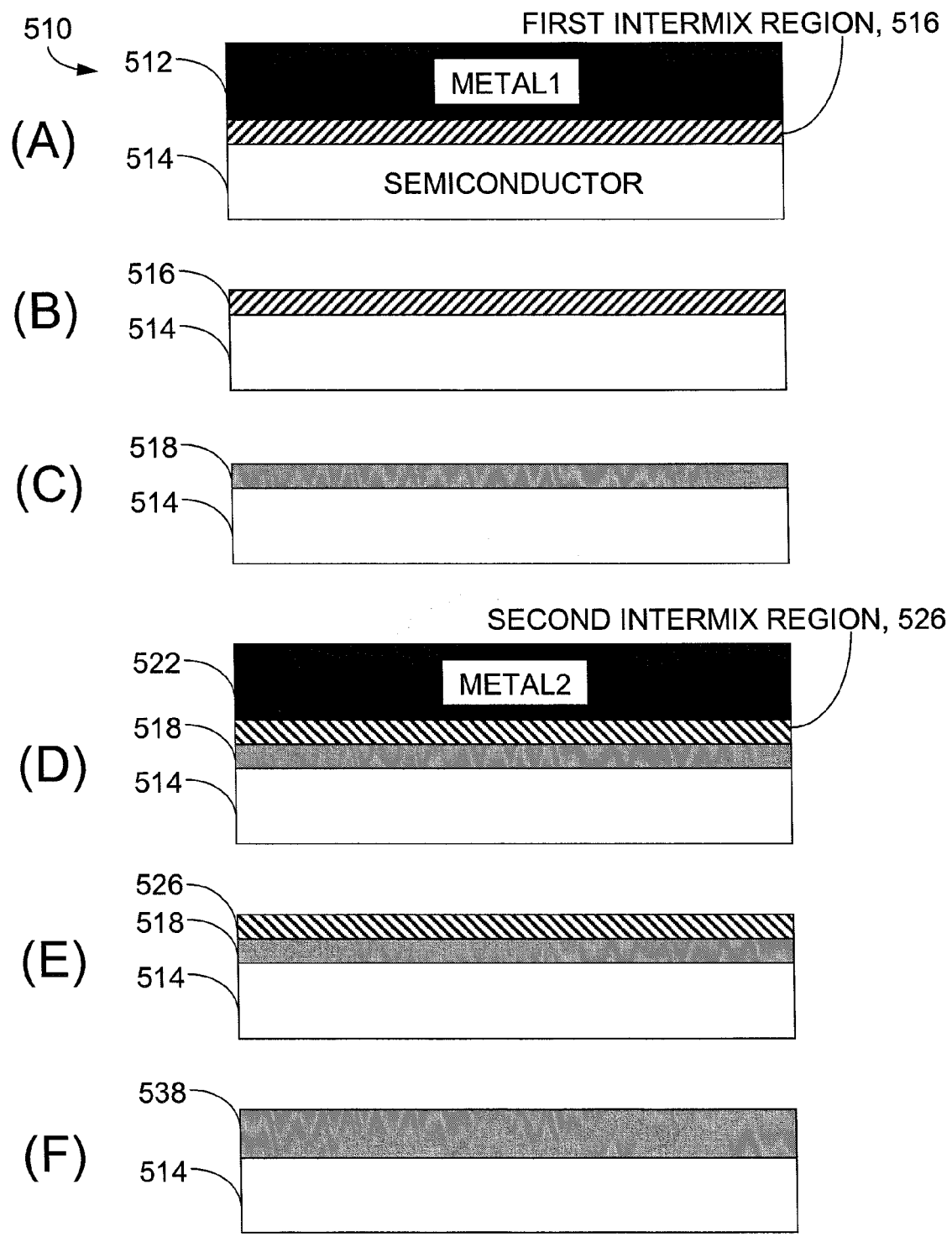
FIG. 5 illustrates another exemplary multi-stage process for forming an intermix region on a semiconductor device in accordance with the exemplary embodiments of the invention.
Figure 6:
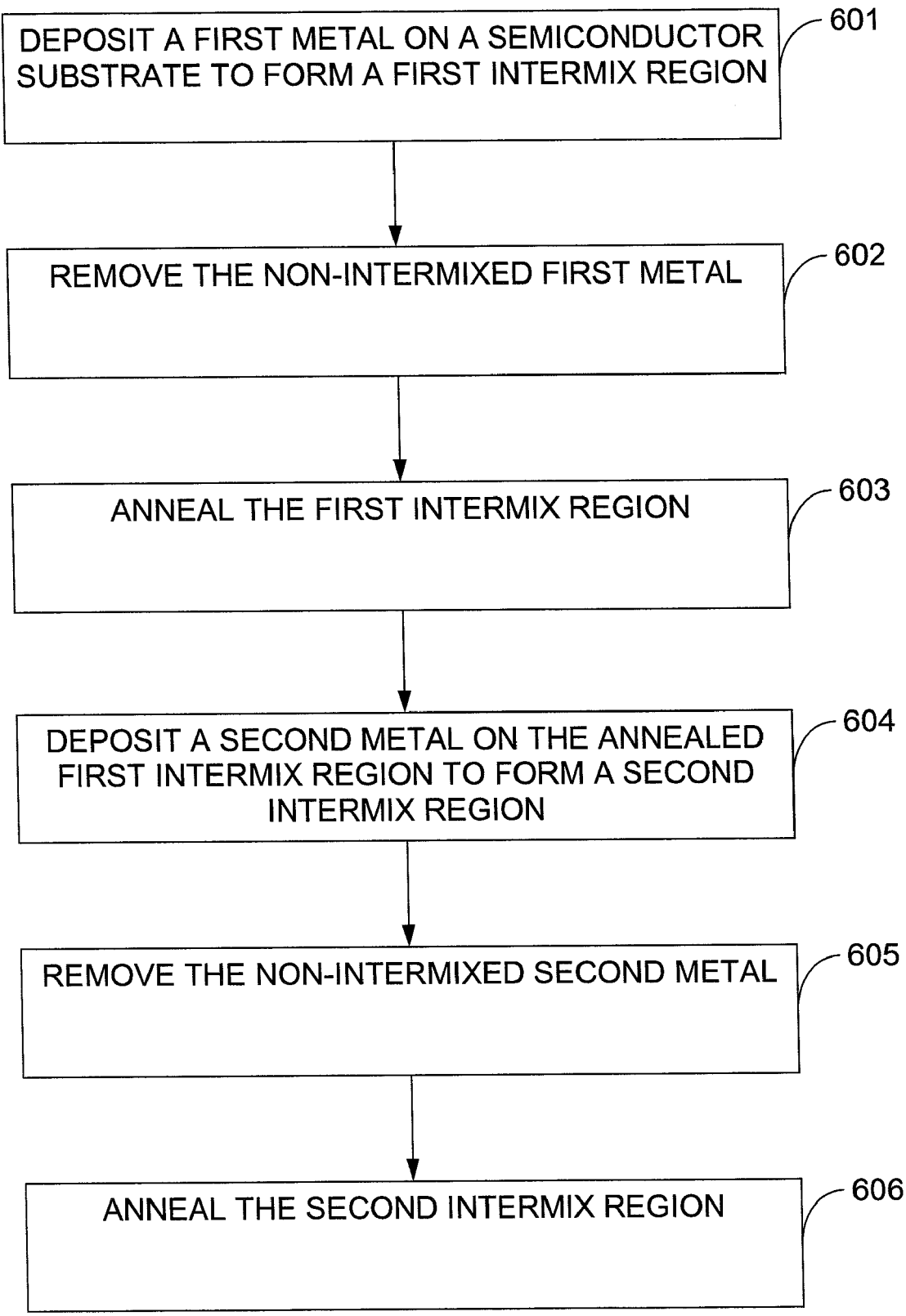
FIG. 6 depicts a flowchart illustrating the steps performed in the exemplary multi-stage process of FIG. 5.

FIG. 5 illustrates another exemplary multi-stage process for forming an intermix region 536 on a semiconductor device 510 in accordance with the exemplary embodiments of the invention. FIG. 6 depicts a flowchart illustrating the steps performed in the exemplary multi-stage process of FIG. 5. In FIG. 5A, a first metal (metal1) 512 is deposited on a semiconductor substrate 514 to form a first intermix region 516 (step 601). In FIG. 5B, the non-intermixed first metal is removed (step 602). At this point, and as an example, the first intermix region 516 may be amorphous. In FIG. 5C, a first anneal is performed in order to crystallize the first intermix region 518 (step 603). In FIG. 5D, a second metal (metal2) 522 is deposited on the annealed first intermix region 518 to form a second intermix region 526 (step 604). In FIG. 5E, the non-intermixed second metal is removed (step 605). At this point, and as an example, the second intermix region 526 may be amorphous. In FIG. 5F, a second anneal is performed to crystallize the second intermix region and form a single intermix region 536 having a lower resistance (step 606).

It should be noted that the structures and processes illustrated in FIGS. 3-6 are exemplary, and may be modified further in accordance with the exemplary embodiments of the invention. For example, in FIGS. 3 and 4 more than two deposition-etch cycles may be performed before the anneal (e.g., deposition1, etch1, deposition2, etch2, deposition3, etch3, . . . , anneal). As another example, in FIGS. 5 and 6 more than two deposition-etch-anneal cycles may be performed (e.g., deposition1, etch1, anneal1, deposition2, etch2, anneal2, deposition3, etch3, anneal3, . . . ). In other exemplary embodiments, the exemplary techniques illustrated in FIGS. 3 and 4 may be combined with the exemplary techniques illustrated in FIGS. 5 and 6 in any suitable manner (e.g., deposition1, etch1, deposition 2, etch2, anneal1, deposition3, etch3, anneal2, . . . ; or deposition1, etch1, anneal1, deposition 2, etch2, deposition3, etch3, anneal2, . . . ; etc.). In further exemplary embodiments, the specific arrangement of steps may be selected in view of desired characteristics and/or properties for the resulting structure.

The exemplary embodiments of the invention may be utilized in conjunction with any suitable metal. As non-limiting examples, the metal may comprise at least one of Co, Ti, Pt, Ni, $Ni_{1-x}Pt_x$ and alloys of these metals. Similarly, the exemplary embodiments of the invention may be utilized in conjunction with any suitable semiconductor material and/or any suitable substrate and/or substrate material. As non-limiting examples, the semiconductor material may comprise at least one of Si, undoped Si and doped Si. As non-limiting examples, the substrate may comprise at least one of Si, undoped Si, doped Si, a silicon-on-insulator substrate, a semiconductor-on-insulator substrate and bulk substrate.

In some exemplary embodiments, it may be desirable to prepare and/or clean the surface prior to deposition of the metal thereon. For example, the substrate may be cleaned and etched (e.g., briefly dipped) in a HF solution (e.g., 2-5% in $H_2O$) to remove any oxide on the surface before loading in the deposition chamber.

As non-limiting examples, the metal may comprise Ni, $Ni_{0.95}Pt_{0.05}$ or $Ni_{0.9}Pt_{0.1}$. The metal may be deposited using sputtering at 1 kW and onto a silicon-on-insulator (SOI) substrate. The SOI substrate may have an undoped top Si layer on the order of about 90 nm thickness. After metal deposition, the metal may be stripped off using $H_2SO_4$: $H_2O_2$=10:1 at 65° C. for Ni or $H_2O:HCl:HNO_3$=4:5:1 at 40° C. for $Ni_xPt_{1-x}$. Subsequently, the structure may undergo annealing in a rapid thermal processing (RTP) chamber at 500° C. for 5 seconds. In further exemplary embodiments, the anneal may be at a temperature of about 400-600° C. In other exemplary embodiments, the anneal may be at a temperature of about 400-800° C. In some exemplary embodiments, selection of the anneal temperature and/or the anneal duration (time) may be dependent on the materials being used (e.g., the characteristics and/or properties of the metal, the semiconductor material and/or the metal-semiconductor alloy). In some exemplary embodiments, the resulting intermix film has a thickness of about 3-6 nm. As further non-limiting examples, the metal may comprise $Ni_{0.8}Pt_{0.2}$ or another combination of NiPt with greater than 20% Pt or with less than 20% Pt. In other exemplary embodiments, the metal may comprise any suitable combination of Ni and Pt (e.g., $Ni_{1-x}Pt_x$). In further exemplary embodiments, the metal may comprise any suitable combination of Ni and another metal. In other exemplary embodiments, the metal may comprise any suitable alloy.

As a non-limiting example, one of the goals of at least some of the exemplary embodiments of the invention is to reduce the sheet resistance of an intermixed film by thickening the intermixed layer. The above-described exemplary multiple intermixing step processes are non-limiting examples of various exemplary techniques that may be utilized to achieve this exemplary goal, as well as other goals. The box shape profile of the silicide layer shows that, at least in some cases, a fair portion of the intermixing is caused by the energy of the incoming atoms (e.g., important solid state amorphization would round the profile at the edges).

While varying the materials and deposition technique may affect the thickness of the intermixed film, these alone have not been found to provide sufficient reduction in sheet resistance. Thus, the exemplary embodiments of the invention address a need in the art by enabling ready formation of a thicker intermixing layer.

In some exemplary embodiments, increasing the energy of the incoming atoms sufficiently would also increase the thickness of the intermixing layer and reduce the sheet resistance. There are many techniques available to accomplish this. For example, if ionized physical vapor deposition (PVD) were used (e.g., instead of sputtering), the ionized metal atoms could be accelerated by adding bias (e.g., via an electric field in the trajectory). This would increase the intermixing layer thickness and reduce the sheet resistance. It is noted that multiple tools are being studied to perform very shallow implants at low energy (e.g., plasma tool, cluster tool). If these principles were applied to metals used in the contact structures, these tools could be utilized to increase the intermixed layer thickness and enable diffusionless silicide formation.

In view of the above, the exemplary multiple intermixed processes described herein could be utilized in conjunction with one or more of these further techniques (e.g., accelerating ionized metal atoms from PVD, plasma tool, cluster tool).

The exemplary embodiments of the invention may be utilized in conjunction with a semiconductor device or semiconductor structure having both at least one p-type field effect transistor (pFET) and at least one n-type FET (nFET). In some exemplary embodiments, it may be desirable to use different metals for different FETs (e.g., for the different types of FETs). As a non-limiting example, the exemplary intermixing scheme may utilize pure Pt and/or pure Ir for the pFET contact(s). As another non-limiting example, the exemplary intermixing scheme may utilize one or more rare earth elements (e.g., Yb, Er, Sc) for the nFET contact(s). As a non-limiting example, the nFET(s) may be masked to perform the exemplary intermix process and/or exemplary multiple intermix process on the pFET(s) (e.g., with Pt or It). Similarly, the pFET(s) may be masked to perform the exemplary intermix process and/or exemplary multiple intermix process on the nFET(s) (e.g., with a rare earth element or alloy, Yb, Er, Sc, an alloy, NiPt, NiEr).

While some of the exemplary embodiments above are described with respect to a Si substrate, the exemplary embodiments of the invention may be utilized in conjunction with any suitable substrate and/or substrate material. As non-limiting examples, the substrate may comprise one or more of: a semiconductor layer comprised of Si, SiGe, Ge, SiC, GaN, GaAs, a semiconductor layer comprised of Ga, a semiconductor layer comprised of Ge, and a semiconductor layer comprised of C.

In some exemplary embodiments, the intermixed region may be comprised of at least 50% Si. In further exemplary embodiments, the amount of substrate material, semiconductor material and/or Si (e.g., proportion, relative proportion, percentage) in the intermixed layer may vary depending on one or more factors including the type of metal being deposited, the composition of the substrate, the energy of the metal atoms being deposited, and/or the conditions of the deposition (e.g., temperature, pressure, reaction, atmosphere), as non-limiting examples. In some exemplary embodiments, it may be desirable to select a target composition of the intermixed layer in terms of proportion of substrate material therein, for example, in view of one or more criteria (e.g., etch selectivity). As a non-limiting example, about 20% Si (e.g., substantially, approximately) may be suitable for NiSi formation with a standard sulfuric/peroxide etch. As another non-limiting example, 35-40% Si (e.g., substantially, approximately) may be suitable for CoSi formation.

In some exemplary embodiments, different metals or compositions may be used for the different intermix layers. In such exemplary embodiments, the usage of different materials may result in lower sheet resistance. In further exemplary embodiments, various process parameters may be changed in order to further modify and/or control the produced intermix layers. For example, the composition and/or thickness of an intermix layer be dependent on one or more factors, including the material the intermix layer is being formed on (e.g., substrate vs. another intermix layer, amorphous intermix layer vs. crystallized intermix layer), as a non-limiting example.

Figure 7:
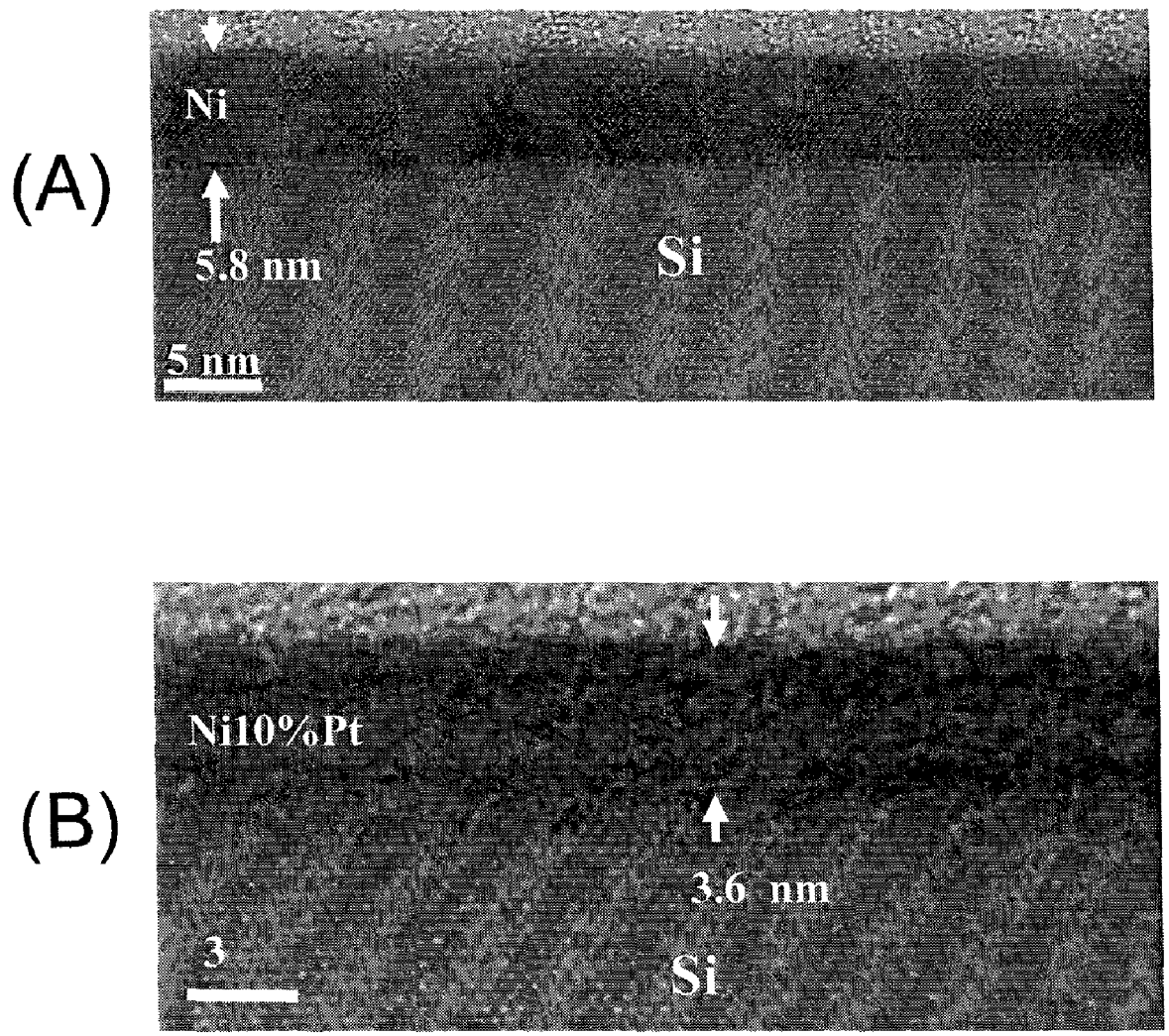
FIG. 7 shows high-resolution transmission electron microscopy (HR-TEM) images for two exemplary semiconductor structures formed in accordance with the exemplary embodiments of the invention.

FIG. 7 shows high-resolution transmission electron microscopy (HR-TEM) images for two exemplary semiconductor structures formed in accordance with the exemplary embodiments of the invention. FIG. 7A shows a first structure wherein Ni (e.g., substantially pure Ni) was deposited on a SOI substrate via sputtering. The intermix film that was formed is substantially uniform and conformal with a thickness of about 5.8 nm. FIG. 7B illustrates a second structure wherein $Ni_{0.9}Pt_{0.1}$ was deposited on a SOI substrate via sputtering. The intermix film that was formed is substantially uniform and conformal with a thickness of about 3.6 nm.

Figure 8:
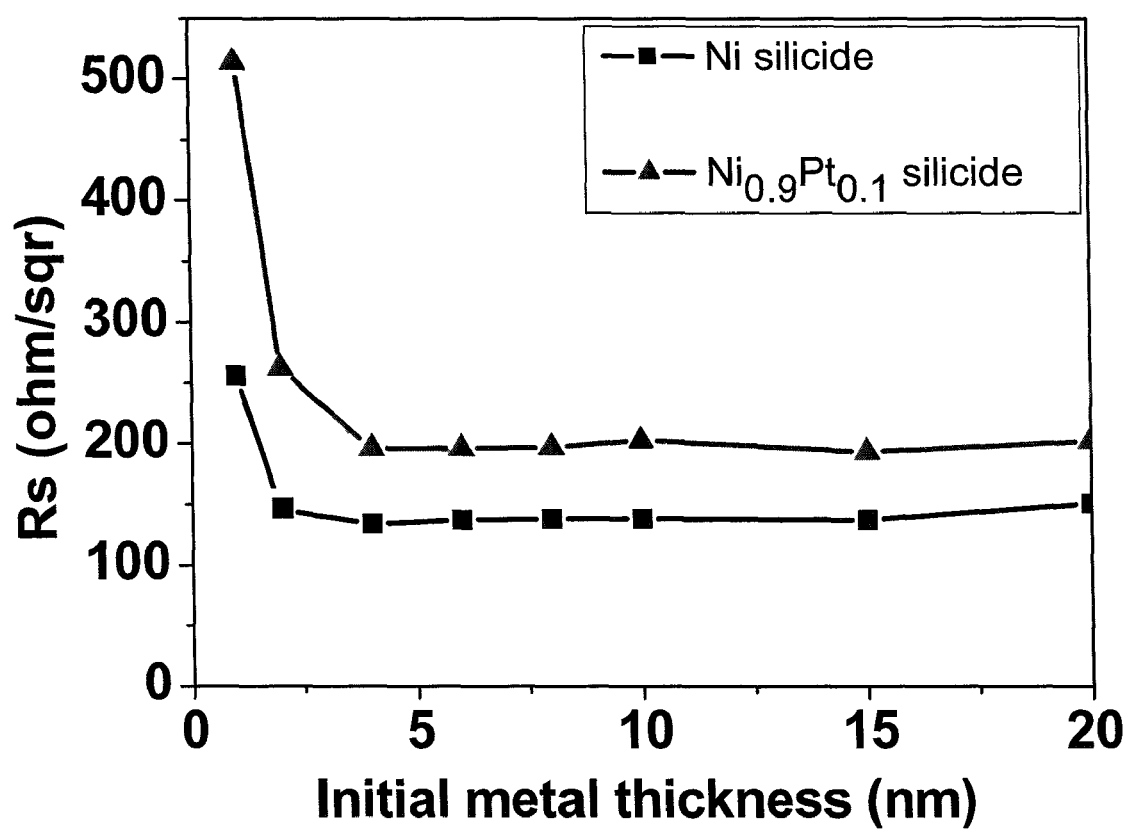
FIG. 8 shows a graph of sheet resistance ($R_s$ measured in Ohms/square) as a function of initial metal thickness (nm) for exemplary films formed using a one-stage process with two different metals.

FIG. 8 shows a graph of sheet resistance ($R_s$ measured in Ohms/square) as a function of initial metal thickness (nm) for exemplary films formed using a one-stage process (see, e.g., FIGS. 1-2) with two different metals, namely Ni and $Ni_{0.9}Pt_{0.1}$. As can be seen, the sheet resistance for all of the exemplary films is above 100 Ohms/square.

Figure 9:
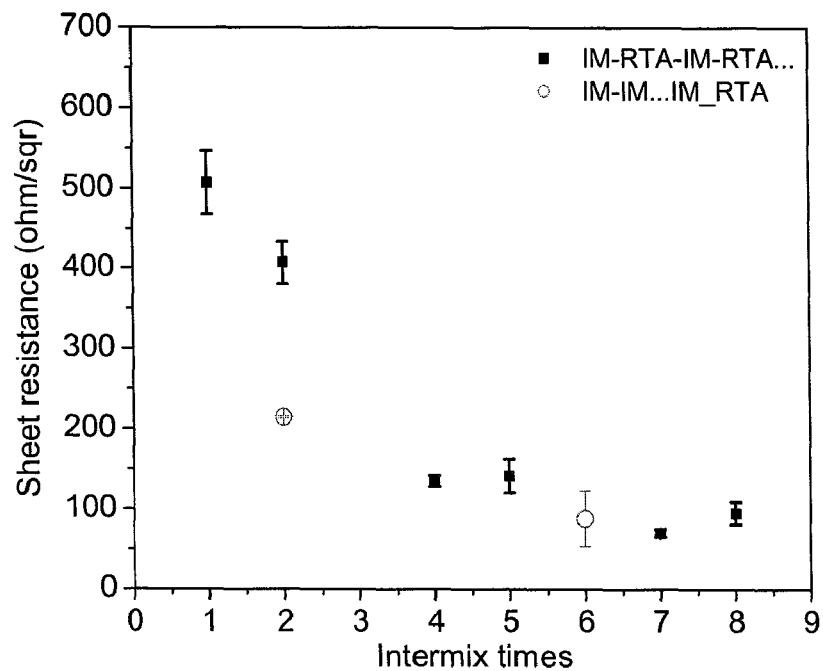
FIG. 9 shows a graph of sheet resistance ($R_s$ measured in Ohms/square) as a function of a number of intermix times for exemplary films formed from $Ni_{0.9}Pt_{0.1}$ (i.e., Ni10% Pt)

FIG. 9 shows a graph of sheet resistance ($R_s$ measured in Ohms/square) as a function of a number of intermix times for exemplary films formed from $Ni_{0.9}Pt_{0.1}$ (i.e., Ni10% Pt). The samples underwent rapid thermal anneal at 500° C. As can be seen, at least for those samples with a number of intermix times from 6 to 8, the sheet resistance was reduced below 100 Ohms/square.

Figure 10:
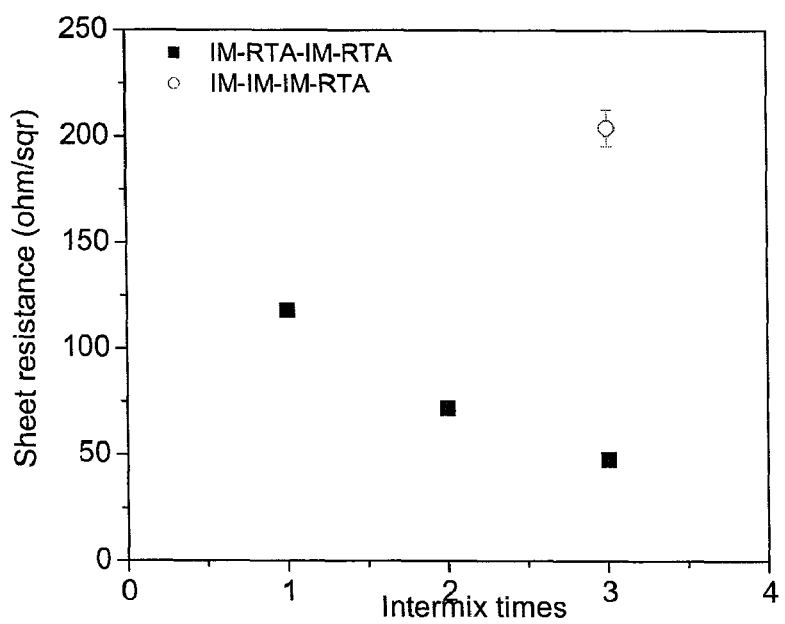
FIG. 10 shows a graph of sheet resistance ($R_s$ measured in Ohms/square) as a function of a number of intermix times for exemplary films formed from Ni.

FIG. 10 shows a graph of sheet resistance ($R_s$ measured in Ohms/square) as a function of a number of intermix times for exemplary films formed from Ni (e.g., substantially pure Ni). The samples underwent rapid thermal anneal at 500° C. As can be seen, at least for those samples with a number of intermix times of 2 or 3 that were formed using a process similar to that of FIGS. 5 and 6 (IM-RTA-IM-RTA), the sheet resistance was reduced below 100 Ohms/square.

The exemplary embodiments of the instant invention, as described above, may be extended to form any suitable number of intermix regions, for example, layered on top of one another. For example, a third intermix region may be formed overlying (e.g., on top of, immediately overlying, immediately adjacent to) the second intermix region. The third intermix region may be formed in a similar manner, for example, by depositing a third metal and, in some exemplary embodiments, removing a portion of the deposited third layer to expose the third intermix region. The third metal may be the same as or different from the first metal and/or the second metal (in any suitable combination).

Further by extension, and as another example, a fourth intermix region may be formed overlying (e.g., on top of, immediately overlying, immediately adjacent to) the third intermix region. The fourth intermix region may be formed in a similar manner, for example, by depositing a fourth metal and, in some exemplary embodiments, removing a portion of the deposited fourth layer to expose the fourth intermix region. The fourth metal may be the same as or different from the first metal, the second metal and/or the third metal (in any suitable combination).

As a further example, a fifth intermix region may be formed overlying (e.g., on top of, immediately overlying, immediately adjacent to) the fourth intermix region. The fifth intermix region may be formed in a similar manner, for example, by depositing a fifth metal and, in some exemplary embodiments, removing a portion of the deposited fifth layer to expose the fifth intermix region. The fifth metal may be the same as or different from the first metal, the second metal, the third metal and/or the fourth metal (in any suitable combination). As is apparent, the exemplary embodiments of the invention may be extended in such a manner to form a layered intermix region comprised of multiple, individually-formed layers (e.g., n layers, where n is an integer and n>1) with the individually-formed layers comprising different or same metals (e.g., in any suitable combination).

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

Figure 11:
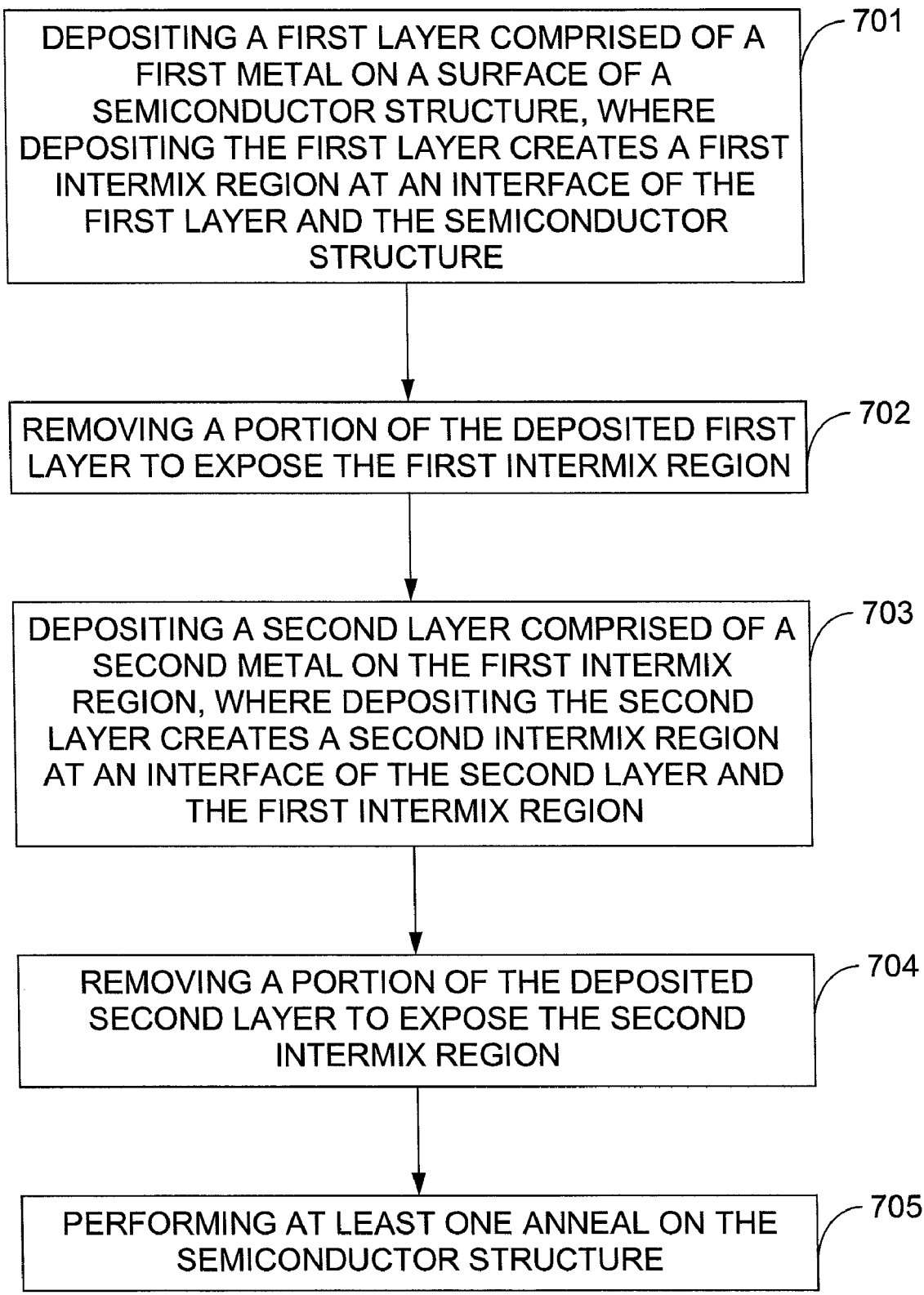
FIG. 11 depicts a flowchart illustrating one non-limiting example of a method for practicing the exemplary embodiments of this invention.

(1) In one exemplary embodiment of the invention, and as shown in FIG. 11, a method comprising: depositing a first layer comprised of a first metal on a surface of a semiconductor structure, where depositing the first layer creates a first intermix region at an interface of the first layer and the semiconductor structure (701); removing a portion of the deposited first layer to expose the first intermix region (702); depositing a second layer comprised of a second metal on the first intermix region, where depositing the second layer creates a second intermix region at an interface of the second layer and the first intermix region (703); removing a portion of the deposited second layer to expose the second intermix region (704); and performing at least one anneal on the semiconductor structure (705).

A method as above, where the first metal is the same as the second metal. A method as in any above, where the first metal is different from the second metal. A method as in any above, where the first metal comprises at least one of Co, Ti, Pt, Ni, Er, Yb, W and a mixture of these. A method as in any above, where the first metal is the same as the second metal and where the first metal comprises at least one of Co, Ti, Pt, Ni, Er, Yb, W and a mixture of these. A method as in any above, where the semiconductor structure comprises a semiconductor material at the surface of the semiconductor structure.

A method as in any above, where depositing the first layer comprises sputtering the first layer onto the surface of the semiconductor structure. A method as in any above, where depositing the second layer comprises sputtering the second layer onto the first intermix region. A method as in any above, where removing the portion of the deposited first layer to expose the first intermix region comprises performing a chemical etch. A method as in any above, where removing the portion of the deposited second layer to expose the second intermix region comprises performing a chemical etch.

A method as in any above, where the removed portion of the deposited first layer comprises non-intermixed first metal. A method as in any above, where the removed portion of the deposited second layer comprises non-intermixed second metal. A method as in any above, where performing the at least one anneal comprises performing a first anneal after removing the portion of the deposited first layer to expose the first intermix region; and performing a second anneal after removing the portion of the deposited second layer to expose the second intermix region. A method as in any above, where performing the at least one anneal comprises performing one anneal after removing the portion of the deposited second layer to expose the second intermix region.

A method as in any above, where at least one of depositing the first layer and depositing the second layer comprises controlling an energy of incident atoms in order to achieve a desired characteristic of at least one of the first intermix region and the second intermix region. A method as in any above, where controlling the energy of the incident atoms comprises controlling an electric field in the trajectory of the incident atoms. A method as in any above, where at least one of depositing the first layer and depositing the second layer comprises performing ionized physical vapor deposition. A method as in any above, where at least one of depositing the first layer and depositing the second layer comprises controlling an energy of incident atoms in order to achieve a desired characteristic of at least one of the first intermix region and the second intermix region, where at least one of depositing the first layer and depositing the second layer comprises performing ionized physical vapor deposition, where controlling the energy of the incident atoms comprises controlling an electric field in the trajectory of the incident atoms.

A method as in any above, where the first metal is different from the second metal. A method as in any above, further comprising: depositing a third layer comprised of a third metal on the second intermix region, where depositing the third layer creates a third intermix region at an interface of the third layer and the second intermix region. A method as in any above, further comprising: depositing a third layer comprised of a third metal on the second intermix region, where depositing the third layer creates a third intermix region at an interface of the third layer and the second intermix region; and removing a portion of the deposited third layer to expose the third intermix region. A method as in any above, where the third metal is the same as the first metal and/or the second metal. A method as in any above, where the third metal is different from the first metal and/or the second metal.

A method as in any above, further comprising: depositing a fourth layer comprised of a fourth metal on the third intermix region, where depositing the fourth layer creates a fourth intermix region at an interface of the fourth layer and the third intermix region. A method as in any above, further comprising: depositing a fourth layer comprised of a fourth metal on the third intermix region, where depositing the fourth layer creates a fourth intermix region at an interface of the fourth layer and the third intermix region; and removing a portion of the deposited fourth layer to expose the fourth intermix region. A method as in any above, where the fourth metal is the same as the first metal, the second metal and/or the third metal (in any suitable combination). A method as in any above, where the fourth metal is different from the first metal, the second metal and/or the third metal (in any suitable combination).

A method as in any above, further comprising: depositing a fifth layer comprised of a fifth metal on the fourth intermix region, where depositing the fifth layer creates a fifth intermix region at an interface of the fifth layer and the fourth intermix region. A method as in any above, further comprising: depositing a fifth layer comprised of a fifth metal on the fourth intermix region, where depositing the fifth layer creates a fifth intermix region at an interface of the fifth layer and the fourth intermix region; and removing a portion of the deposited fifth layer to expose the fifth intermix region. A method as in any above, where the fifth metal is the same as the first metal, the second metal, the third metal and/or the fourth metal (in any suitable combination). A method as in any above, where the fifth metal is different from the first metal, the second metal, the third metal and/or the fourth metal (in any suitable combination).

A method as in any above, where performing the at least one anneal comprising performing a final anneal on the semiconductor structure after a final removal of a portion of a top deposited layer to expose a top intermix region. A method as in any above, where performing the at least one anneal on the semiconductor structure consists of performing only one anneal on the semiconductor structure (e.g., after a final removal, after a final removal of a portion of a top deposited layer to expose a top intermix region). A method as in any above, further comprising one or more aspects of the exemplary embodiments of the invention as described herein.

A method as in any above, implemented as a computer program. A method as in any above, implemented as a computer program stored (e.g., tangibly embodied) on a computer-readable medium (e.g., a program storage device, a memory, a computer-readable memory medium, a non-transitory program storage device). A computer program comprising program instructions that, when performed by a processor, perform operations according to one or more (e.g., any one) of the methods described herein. A method as in any above, implemented as a program of instructions tangibly embodied on a program storage device, execution of the program of instructions by an apparatus (e.g., processor, data processor, machine, computer) resulting in operations comprising the steps of the method.

(2) In another exemplary embodiment of the invention, a program storage device readable by a machine, tangibly embodying a program of instructions executable by the machine for performing operations, said operations comprising: depositing a first layer comprised of a first metal on a surface of a semiconductor structure, where depositing the first layer creates a first intermix region at an interface of the first layer and the semiconductor structure (701); removing a portion of the deposited first layer to expose the first intermix region (702); depositing a second layer comprised of a second metal on the first intermix region, where depositing the second layer creates a second intermix region at an interface of the second layer and the first intermix region (703); removing a portion of the deposited second layer to expose the second intermix region (704); and performing at least one anneal on the semiconductor structure (705).

A program storage device as in any above, further comprising one or more aspects of the exemplary embodiments of the invention as described herein.

(3) In a further exemplary embodiment of the invention, an apparatus comprising: means for depositing a first layer comprised of a first metal on a surface of a semiconductor structure, where depositing the first layer creates a first intermix region at an interface of the first layer and the semiconductor structure; means for removing a portion of the deposited first layer to expose the first intermix region; means for depositing a second layer comprised of a second metal on the first intermix region, where depositing the second layer creates a second intermix region at an interface of the second layer and the first intermix region; means for removing a portion of the deposited second layer to expose the second intermix region; and means for performing at least one anneal on the semiconductor structure (705).

An apparatus as in any above, further comprising one or more aspects of the exemplary embodiments of the invention as described herein.

Figure 12:
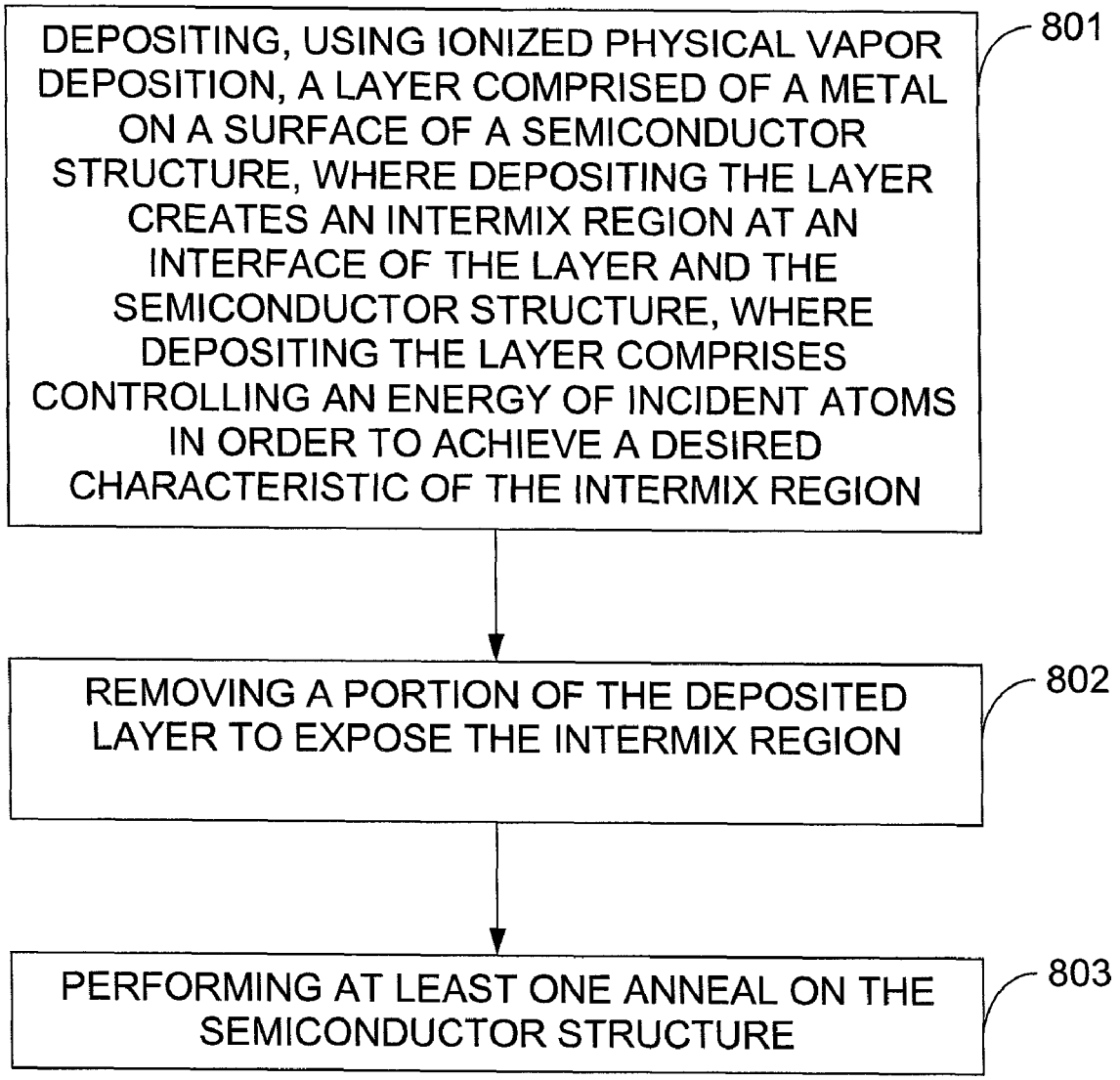
FIG. 12 depicts a flowchart illustrating another non-limiting example of a method for practicing the exemplary embodiments of this invention.

(4) In another exemplary embodiment of the invention, and as shown in FIG. 12, a method comprising: depositing, using ionized physical vapor deposition, a layer comprised of a metal on a surface of a semiconductor structure, where depositing the layer creates an intermix region at an interface of the layer and the semiconductor structure, where depositing the layer comprises controlling an energy of incident atoms in order to achieve a desired characteristic of the intermix region (801); and removing a portion of the deposited layer to expose the intermix region (802).

A method as above, further comprising: performing at least one anneal on the semiconductor structure (803). A method as in any above, where the desired characteristic comprises a desired thickness (e.g., of the intermix region). A method as in any above, where controlling the energy of the incident atoms comprises controlling an electric field in the trajectory of the incident atoms. A method as in any above, further comprising one or more aspects of the exemplary embodiments of the invention as described herein.

A method as in any above, implemented as a computer program. A method as in any above, implemented as a computer program stored (e.g., tangibly embodied) on a computer-readable medium (e.g., a program storage device, a memory, a computer-readable memory medium, a non-transitory program storage device). A computer program comprising program instructions that, when performed by a processor, perform operations according to one or more (e.g., any one) of the methods described herein. A method as in any above, implemented as a program of instructions tangibly embodied on a program storage device, execution of the program of instructions by an apparatus (e.g., processor, data processor, machine, computer) resulting in operations comprising the steps of the method.

(5) In a further exemplary embodiment of the invention, a program storage device readable by a machine, tangibly embodying a program of instructions executable by the machine for performing operations, said operations comprising: depositing, using ionized physical vapor deposition, a layer comprised of a metal on a surface of a semiconductor structure, where depositing the layer creates an intermix region at an interface of the layer and the semiconductor structure, where depositing the layer comprises controlling an energy of incident atoms in order to achieve a desired characteristic of the intermix region (801); and removing a portion of the deposited layer to expose the intermix region (802).

A program storage device as above, the operations further comprising: performing at least one anneal on the semiconductor structure (803). A program storage device as in any above, further comprising one or more aspects of the exemplary embodiments of the invention as further herein.

(6) In another exemplary embodiment of the invention, an apparatus comprising: means for depositing, using ionized physical vapor deposition, a layer comprised of a metal on a surface of a semiconductor structure, where depositing the layer creates an intermix region at an interface of the layer and the semiconductor structure, where the means for depositing the layer is further for controlling an energy of incident atoms in order to achieve a desired characteristic of the intermix region; and means for removing a portion of the deposited layer to expose the intermix region.

An apparatus as above, further comprising means for performing at least one anneal on the semiconductor structure. An apparatus as in any above, further comprising one or more aspects of the exemplary embodiments of the invention as described herein.

The exemplary embodiments of the invention, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise steps of utilizing the exemplary embodiments or steps of the method.

The blocks shown in FIGS. 2, 4, 6, 11 and 12 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 2, 4, 6, 11 and 12 should be considered merely exemplary and non-limiting. It should be appreciated that the blocks shown in FIGS. 2, 4, 6, 11 and 12 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 2, 4, 6, 11 and 12 so as to implement one or more further exemplary embodiments of the invention.

That is, the exemplary embodiments of the invention shown in FIGS. 2, 4, 6, 11 and 12 may be utilized, implemented or practiced in conjunction with one or more further aspects in any combination (e.g., any combination that is suitable, practicable and/or feasible) and are not limited only to the steps, blocks, operations and/or functions shown in FIGS. 2, 4, 6, 11 and 12.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The terminology used herein is for the purpose of describing particular exemplary embodiments only and is not intended to be limiting of the exemplary embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless described otherwise herein, "depositing" may include any now known or later developed techniques appropriate for the material to be deposited, including, but not limited to: chemical vapor deposition (CVD), low-pressure CVD (LPCVD), plasma-enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), ionized PVD, atomic layer deposition (ALD), chemical oxidation, molecular beam epitaxy (MBE), plating or evaporation.

While the exemplary embodiments of the invention are described above primarily with regard to sputtering, it should be appreciated that the exemplary embodiments of the invention may be utilized in conjunction with any suitable deposition technique. As an example, CVD or ALD may be utilized, though these deposition techniques may result in thinner intermix regions and layers (e.g., due to the lower energy of the atoms being deposited).

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A non-transitory computer-readable medium storing a program of instructions executable by a machine for performing operations, said operations comprising:
   depositing a first layer comprised of a first metal on a surface of a semiconductor structure, where depositing the first layer creates a first intermix region at an interface of the first layer and the semiconductor structure;
   removing a portion of the deposited first layer to expose the first intermix region;
   depositing a second layer comprised of a second metal on the first intermix region, where depositing the second layer creates a second intermix region at an interface of the second layer and the first intermix region;
   removing a portion of the deposited second layer to expose the second intermix region; and
   performing at least one anneal on the semiconductor structure, where no anneal is performed prior to removal of the portion of the deposited second layer where the removed portion of the deposited first layer comprises non-intermixed first metal, and where the removed portion of the deposited second layer comprises non-intermixed second metal.

2. The computer-readable medium of claim 1, where the first metal is the same as the second metal.

3. The computer-readable medium of claim 1, where the first metal comprises at least one of Co, Ti, Pt, Ni, Er, Yb and W.

4. The computer-readable medium of claim 1, where the first metal is the same as the second metal and where the first metal comprises at least one of Co, Ti, Pt, Ni, Er, Yb and W.

5. The computer-readable medium of claim 1, where the first metal is different from the second metal.

6. The computer-readable medium of claim 1, where depositing the first layer comprises sputtering the first layer onto the surface of the semiconductor structure.

7. The computer-readable medium of claim 1, where depositing the second layer comprises sputtering the second layer onto the first intermix region.

8. The computer-readable medium of claim 1, the operations further comprising: depositing a third layer comprised of a third metal on the second intermix region, where depositing the third layer creates a third intermix region at an interface of the third layer and the second intermix region.

9. The computer-readable medium of claim 1, where performing the at least one anneal on the semiconductor structure consists of performing only one anneal on the semiconductor structure.

10. A method comprising:
depositing a first layer comprised of a first metal on a surface of a semiconductor structure, where depositing the first layer creates a first intermix region at an interface of the first layer and the semiconductor structure;
removing a portion of the deposited first layer to expose the first intermix region;
depositing a second layer comprised of a second metal on the first intermix region, where depositing the second layer creates a second intermix region at an interface of the second layer and the first intermix region;
removing a portion of the deposited second layer to expose the second intermix region; and
performing at least one anneal on the semiconductor structure, where no anneal is performed prior to removal of the portion of the deposited second layer where the removed portion of the deposited first layer comprises non-intermixed first metal, and where the removed portion of the deposited second layer comprises non-intermixed second metal.

11. The method of claim 10, where performing the at least one anneal comprises performing one anneal after removing the portion of the deposited second layer to expose the second intermix region.

12. The method of claim 10, where at least one of depositing the first layer and depositing the second layer comprises controlling an energy of incident atoms in order to achieve a desired characteristic of at least one of the first intermix region and the second intermix region.

13. The method of claim 12, where controlling the energy of the incident atoms comprises controlling an electric field in the trajectory of the incident atoms.

14. The method of claim 10, where at least one of depositing the first layer and depositing the second layer comprises performing ionized physical vapor deposition.

15. The method of claim 10, where at least one of depositing the first layer and depositing the second layer comprises controlling an energy of incident atoms in order to achieve a desired characteristic of at least one of the first intermix region and the second intermix region, where at least one of depositing the first layer and depositing the second layer comprises performing ionized physical vapor deposition, where controlling the energy of the incident atoms comprises controlling an electric field in the trajectory of the incident atoms.

* * * * *